METHOD OF TREATING SOLAR CELLS

Filed March 3, 1965

INVENTORS
THOMAS K. TSAO
MICHAEL YU
BY Emery L. Groff Jr.
ATTORNEY

METHOD OF TREATING SOLAR CELLS

Filed March 3, 1965

INVENTORS
THOMAS K. TSAO
MICHAEL YU
BY Emery L. Groff Jr.
ATTORNEY

United States Patent Office 3,436,275
Patented Apr. 1, 1969

3,436,275

METHOD OF TREATING SOLAR CELLS

Thomas K. Tsao, 4306 Sarasota Place, and Michael Yu, 4307 Yates Road, both of Beltsville, Md. 20705

Filed Mar. 3, 1965, Ser. No. 436,877
Int. Cl. H01l 7/18
U.S. Cl. 148—1.5 11 Claims

ABSTRACT OF THE DISCLOSURE

A method of treating solar cells to improve the current response characteristics thereof comprising (1) placing a solar cell in an electric field of the same polarity as the cell (2) simultaneously subjecting the solar cell to constant heat and (3) maintaining the solar cell in the electric field at elevated temperature to obtain the desired current response characteristics.

This invention relates broadly to photosensitive semiconductors and more particularly to a method or process of treating solar cells to improve the response characteristics thereof.

The main object of the present invention is to provide a method of treating solar cells to improve the current response characteristics thereof.

Another object of the invention is to provide a method of treating photosensitive semiconductors, such as solar cells, either during or after manufacture of the same, to increase the efficiency of the solar cells.

Still another object of the invention is to provide a process for treating solar cells to render them more efficient for terrestrial applications.

A further object of the invention is to provide a method of treating solar cells or solar batteries to change the wave length response to thus obtain a greater quantum yield at a desired wave length.

Other and further objects of the invention will become apparent to those skilled in the art by reference to the specification and drawings, which set forth the invention in greater detail, in which.

The present invention is concerned with solar cells which are single junction photosensitive semiconductors, commonly referred to as PN junctions. All single junction solar cells are normally classified in two categories, N on P or P on N type and the process of the present invention is applicable to both types of cells.

In semiconductor material of the type used in the manufacture of solar cells light energy concentrated on the photosensitive area causes movement of the carriers in the semiconductor material, causing current flow through the semiconductor, thus converting the light energy to electric energy for many useful applications. Either sunlight or artificial light may be utilized to energize a solar cell, but the output of the cell is dependent upon the intensity of the light received thereby. The efficiency of a solar cell in converting light energy to electric energy is determined by the quantum yield of the cell.

The quantum yield of solar cells presently on the market varies from manufacturer to manufacturer and it is well known that the quantum yield of any particular solar cell has a maximum at a particular wave length. The present invention is directed to a process for treating solar cells either during the manufacturing stage or after the manufacture is completed, which increases the current output of the solar cell, thus improving its current response characteristics, and which increases the quantum yield of the cell at a particular wave length of light energy under the same intensity conditions. The process basically consists of placing a solar cell or a plurality of solar cells, or the component parts of solar cells prior to their assembly into the completed product, in an electric field, and by increasing the temperature around the cell subjecting it to a constant predetermined temperature. The quantum yield of the solar cell is increased or decreased, depending upon the intensity and polarity of the electric field, the temperature range to which the cell is subjected and the length of time the cell is simultaneously maintained in the electric field and subjected to the elevated temperature. By treating solar cells according to the process of the present invention it has been found that the solar cells operate with higher efficiency and the percentage of rejection of solar cells as not meeting required standards is greatly reduced.

Figure 1:
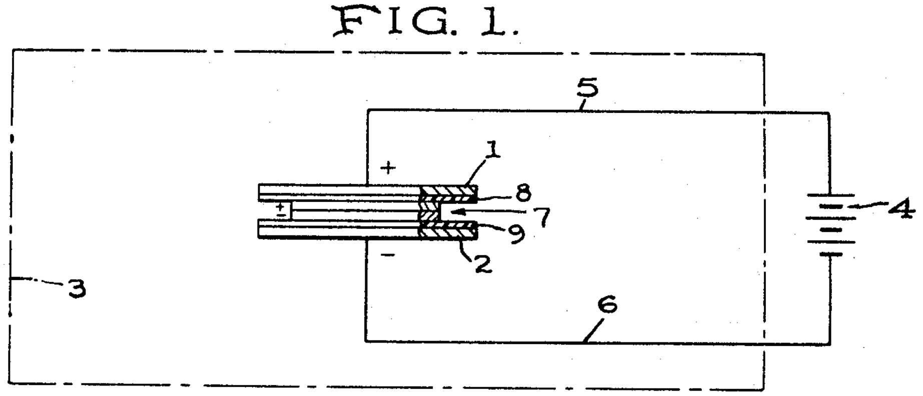
FIG. 1 is a schematic diagram showing the arrangement of treating a solar cell according to the method of the present invention.

Referring to FIG. 1, a pair of electrically conductive plates 1 and 2 are positioned in an environmental chamber, such as a hot chamber, schematically illustrated at 3, with the plates connected to opposite terminals of an external D.C. power source 4 through conductors 5 and 6, respectively. Before connecting the battery of external power source 4 to the plates 1 and 2 a solar cell, indicated generally at 7, is placed between the metal plates and separated from them only by thin layers of electrical insulation material 8 to 9 to prevent direct contact of the solar cell terminals to the external power source.

The process of the invention is applicable to all solar cells presently on the commercial market, both the N on P type and the P on N type. The most common type of solar cells presently on the commercial market have solder joints at the terminals on opposite sides thereof, such as for instance, as found on the solar cells produced by International Rectifier Corporation. The terminals on opposite sides of the solar cell, which are used to connect the cell into a circuit, would normally make electrical contact with the plates 1 and 2 and it is these terminals which must be insulated from the plates as shown at 8 and 9. This insulation material should be kept as thin as possible so as to keep the spacing between the plates 1 and 2 as small as possible to maintain the strength of the electric field but at the same time it must be able to withstand the required temperature and voltage to which it is subjected without breakdown, and by way of example, the insulation material 8 and 9 may be Mylar tape metalized on one side and of a thickness of approximately .015 inch which has been found to satisfy all requirements of the process. If the thickness of the insulation layers 8 and 9 is increased, a higher D.C. potential must be impressed across the plates 1 and 2 to complete the process in the same amount of time since the added thickness of the insulation material increases the spacing between the plates and thus decreases the electric field intensity.

In actual practice the solar cells, or solar cell, are placed on one of the plates 2 and the top plate 1 is then placed on top of the solar cells and the two plates are clamped together by suitable insulation clamping means. It is important to note that the solar cells are placed on the plates in the same polarity as the polarity of the electric field to be developed between the plates. That is, the positive terminal of solar cell 7 is placed adjacent conductive plate 1 which is connected to the positive terminal of battery 4, while the negative terminal of the solar cell is placed adjacent conductive plate 2 which is connected to the negative terminal of battery 4. The solar cells, component parts of solar cells, or solar cell, are thus sandwiched between the two electrically conductive plates and insulated therefrom.

The hot chamber 3 is then closed and the potential of power source 4 which is preferably in the range of 150 volts D.C. to 1500 volts D.C. is then impressed across plates 1 and 2. Simultaneously the temperature of the hot chamber is increased and maintained at a heat in the range of 150° centigrade (C.) and above, with the top range of the heat to which the solar cell is subjected being determined by the heat limitations of the materials used in the construction of the particular type solar cells being treated. For instance, in the commercially available solar cells, previously mentioned, having terminal electrodes connected to opposite sides with solder joint connections, low melting point type solder is used in the construction of many of these solar cells and a temperature above 275° C. will cause the solar material to melt and thus damage the solar cell. Thus with solar cells having this type construction the temperature of the hot chamber 3 cannot exceed 275° C. However, some types of solar cells, just recently introduced on the commercial market, do not have solder joints at their terminal electrodes, and, therefore, temperatures above 275° C. may be used for treating the newer type cells with the process of the invention.

Throughout the process the solar cell is thus subjected to a constant temperature while simultaneously being subjected to the effects of the electrostatic field between the plates. It is believed that by simultaneously subjecting the material of the N and P layers of the solar cell to an elevated heat and an electric field of substantial strength, the structure of the semiconductor material, which is normally crystalline, is in some way altered, and/or the PN junction barrier or the depletion region is in some way altered, by rearrangement of the ions or electrons.

Figure 2:
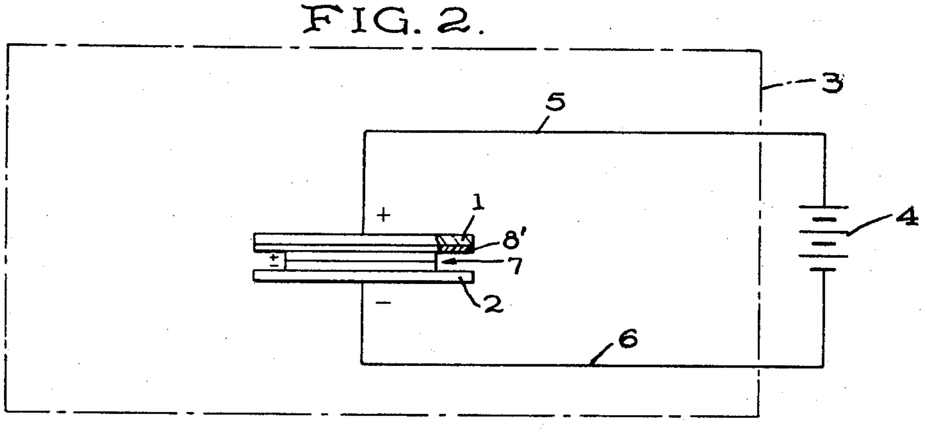
FIG. 2 is a schematic view similar to FIG. 1, showing a modified arrangement for treating solar cells according to the method of the invention.
Figure 3:
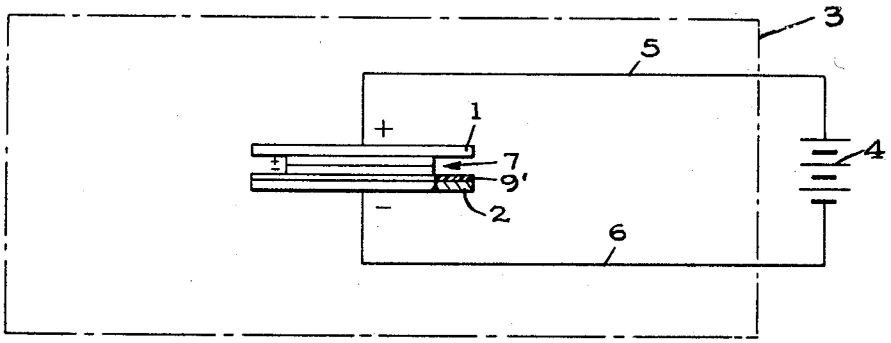
FIG. 3 is a schematic view showing a further modified arrangement of treating solar cells according to the method of the invention.

Modified forms of the process of the invention are illustrated in FIGS. 2 and 3 and it has been found that the time required for processing the solar cell to obtain the higher efficiency of operation is shorter with the methods illustrated in FIGS. 2 and 3 than with the method illustrated in FIG. 1. In the method illustrated in FIG. 2 the negative terminal of solar cell 7 is electrically connected directly to electrically conductive plate 2 which is connected to the negative side of external power source 4, while the positive terminal of solar cell 7 is spaced from plate 1, which is connected to the positive terminal of power source 4 by the layer of insulating material illustrated at 8′. The process is the same as that described in connection with the arrangement according to FIG. 1, except that only one of the solar cell terminals is insulated from one of the conducting plates, rather than both of the terminals being insulated from the plates.

A similar but modified form of the process, illustrated in FIG. 2, is illustrated in FIG. 3, wherein the positive teminal of solar cell 7 is placed in direct electrical contact with conducting plate 1 which is connected to the positive terminal of power source 4 while only the negative terminal of solar cell 7 is insulated from electrically conductive plate 2, as illustrated at 9′, where plate 2 is connected to the negative terminal of power source 4. When practicing the method as illustrated in FIGS. 2 and 3, it has been found that the efficiency of a solar cell can be further improved and that the required time for the process can be greatly shortened. The length of time that the solar cell is subjected to the elevated heat and the electric field is determined by the increase in solar cell response that is desired and it has been found that the efficiency of a solar cell can be increased by treating the same with the method for a period of two minutes up to approximately sixty minutes. The time required for the process is of course dependent upon the voltage and temperature used. Since, at higher voltages the solar cell is subjected to electric fields of greater strength, optimum response results are achieved with a definite value of voltage in a shorter period of time. The same is true of the temperature to which the solar cell is subjected. In any event, response results are obtained in a shorter period of time when the cell is subjected to higher temperatures.

After treating a solar cell according to the process of the invention disclosed in either FIGS. 1, 2 or 3, the external power source is disconnected and the solar cells removed from the hot chamber 3 and allowed to cool and anneal at room temperature for a period of at least twelve hours. It has also been found that solar cells can be immediately cooled for immediate use by quenching them in sub-zero temperatures for a few minutes.

Figure 5:
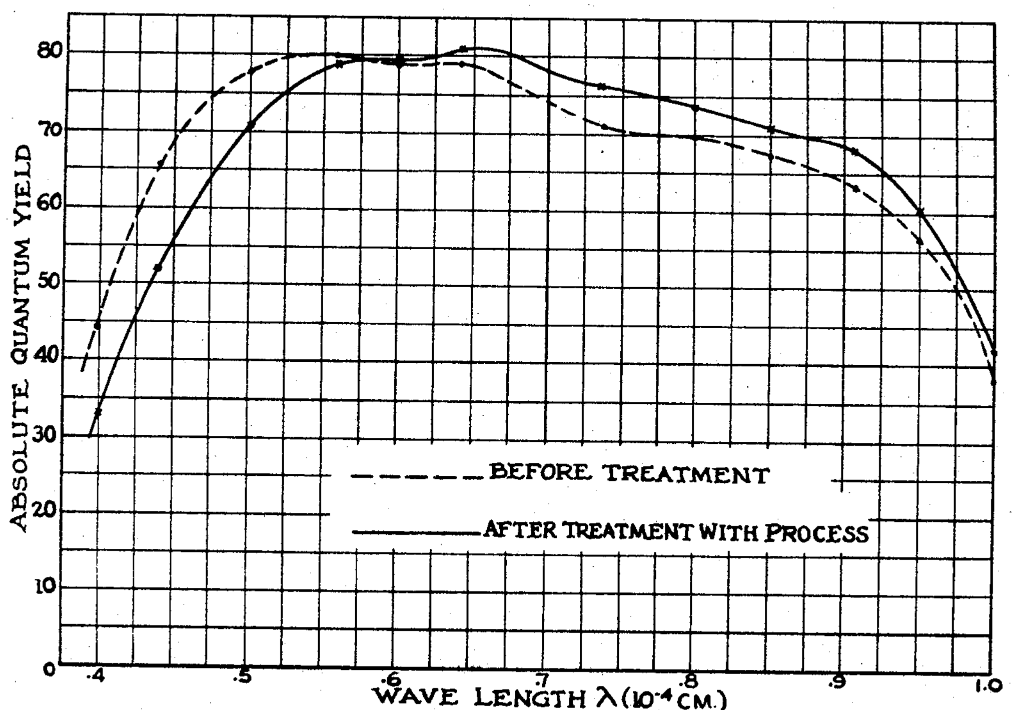
FIG. 5 is a graph of absolute quantum yield versus wave length, showing the response of a solar cell before and after treatment according to the process of the invention.
Figure 4:
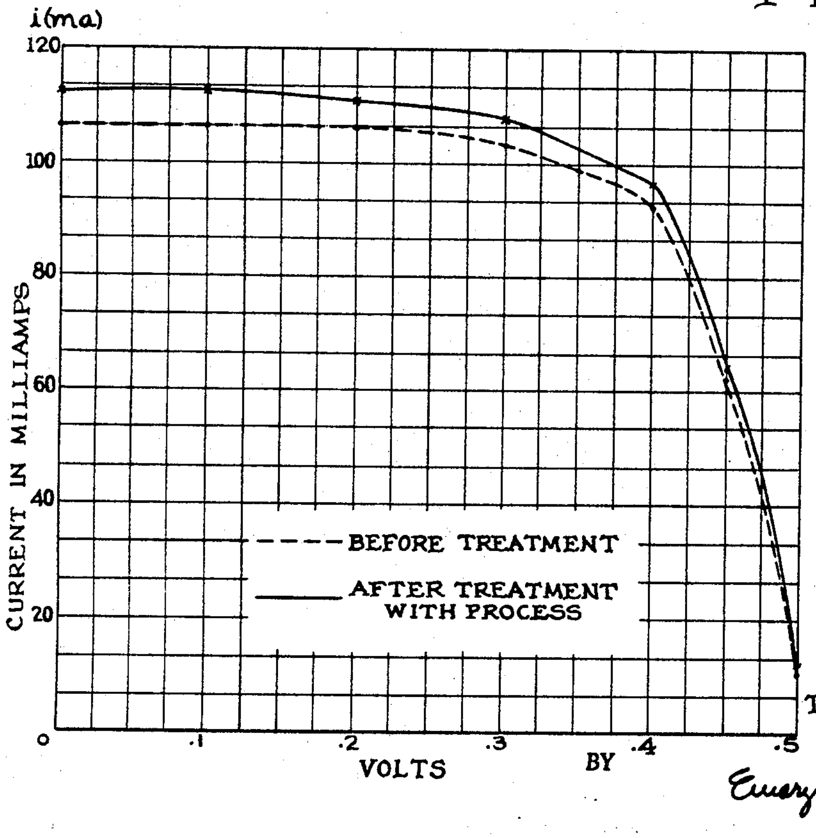
FIG. 4 is a current versus voltage graph showing the response of a solar cell before and after treatment according to the method of the invention.

Typical curves of response characteristic of a solar cell are shown in FIGS. 4 and 5 with each of the graphs showing the response of a solar cell before and after treatment with the process of the present invention. A solar cell of the type previously mentioned having its terminal electrodes connected thereto by means of solder joints, was chosen, and its current versus voltage response was plotted as indicated by the dotted line graph in FIG. 4, and its absolute quantum yield versus wave length response was plotted as indicated by the dotted line curve of the graph of FIG. 5. It should be noted in FIG. 5 that the absolute quantum yield of the solar cell, before treatment with the process, was a maximum of 80 at a wavelength of received radiation of approximately .55 x $10^{-4}$ centimeters. For terrestrial applications it is preferred to have a greater quantum yield at a radiation wave length closer to a longer wave length range, and it would therefore be advantageous to shift the maximum peak of the quantum yield curve toward the right in the graph of FIG. 5. For operation of solar cells in space applications it is more desirable to have the peak quantum yield at a wave length closer to the shorter wave length region of the spectrum, that is closer to the left hand portion of the graph. The solar cell under test was for use in terrestrial applications and it was therefore desired to shift the quantum yield peak toward the right on the FIG. 5 graph.

The solar cell was placed in a hot chamber 3 between plates 1 and 2 according to the method set forth in FIG. 2 of the drawings, that is insulating the positive terminal of the solar cell 7 from the positively charged conducting plate 1 by means of a Mylar insulation strip as indicated at 8′. An external power source 4 of 600 volts D.C. was connected as shown in FIG. 2 to plates 1 and 2 to establish an electrical field therebetween in which the solar cell was dispersed. The temperature of the hot chamber 3 was limited to operation in the temperature range of 150° C. to 275° C. because of the solder joint connections of the solar cell terminals and a temperature of 175° C. was therefore chosen, and the heat in that chamber was raised to this temperature and held constant. The solar cell was subjected to the electric field established by the 600 volt D.C. source and the constant 175° C. temperature for a period of one hour. The solar cell was then removed from the hot chamber and allowed to cool at room temperature for a period of twelve hours. After cooling, the performance characteristics were again measured and recorded, as indicated in the solid line curves on the graphs of FIGS. 4 and 5. The data for these graphs were procured twenty-four hours after processing the solar cell by the method according to FIG. 2. FIG. 4 indicates that after treatment with the process of the invention the solar cell had a much better efficiency. As one skilled in the art will recognize, a very slight improvement in the efficiency of a solar cell is a substantial step forward in solar cell development. From the solid line curve of FIG. 5, it will be seen that the absolute quantum yield of the solar cell was raised from 80 to approximately 81.5 and the maximum quantum yield was now obtained at a wave length of approximately .66 x $10^{-4}$ centimeters. After treatment the response of the solar cells was then more efficient to longer wave lengths of radiation, thus making the solar cell better suited for terrestrial applications, since by shifting the quantum yield curve to the right the solar cell responds more efficiently to wave lengths in the near infra-red region of the spectrum, which wave lengths are used extensively in terrestrial applications.

It has been found that the effects of the process on a solar cell are permanent and that the solar cells continue to operate at the increased efficiency and continue to render greater response at the newly selected wave length. No signs of deterioration of the improved response of solar cells caused by the process have been observed even after a substantial period subsequent to the treatment. The preferred temperature range for the process is 150° C. to 300° C.

By varying the length of time, the solar cell is subjected to the electric field and the elevated temperature, and also by varying the field strength and temperature, the solar cell can be made to render its maximum quantum yield at a desired wave length, where maximum yield is required at a selected wave length for a particular purpose. It is also believed that with further refinement the process may be utilized to obtain maximum yield from a solar cell at wave lengths closer to the visible light wave lengths, that is the wave lengths toward the left side of the graph of FIG. 5.

The D.C. power source 4 may be a pulsating power source, and it has been found that the process may be completed more quickly when a pulsing D.C. power source is utilized in lieu of a constant current D.C. source.

While the inventive process has been illustrated and described in certain preferred embodiments, it is realized that modifications may be made without departing from the spirit of the invention, and it is to be understood that no limitations upon the process of the invention are intended other than those imposed by the scope of the appended claims.

What is claimed is:

1. The method of treating solar cells to improve the current response characteristics thereof comprising:

(1) placing a solar cell in an electric field of the same polarity as the cell and of a strength comparable with an electric field produced between two plates, spaced by a solar cell, and energized by a D.C. source in the range of 150 to 1500 volts, (2) simultaneously subjecting the solar cell to constant heat at a temperature in the range of 150° C. to 300° C., and (3) maintaining the solar cell in the electric field at elevated temperature for a predetermined period of time in the range of two minutes to one hour to obtain the desired current response characteristic.

2. The method as set forth in claim 1 including the step of cooling the solar cell at room temperature.

3. The method as set forth in claim 1 including the step of quenching the solar cell in sub-zero temperature to immediately cool the same.

4. The method of treating solar cells to improve the response characteristics thereof comprising:

(1) placing a solar cell in a pulsating electric field of the same polarity as the cell and of a strength comparable with a pulsating electric field produced between two plates spaced by a solar cell and energized by a pulsing D.C. source in the range of 150 volts to 1500 volts, (2) simultaneously subjecting the solar cell to constant heat at a temperature in the range of 150° C. to 300° C., and (3) maintaining the solar cell in the pulsing electric field at elevated temperature for a predetermined period of time in the range of two minutes to one hour to obtain the desired response characteristic.

5. The method of treating solar cells to improve the response characteristics thereof comprising:

(1) placing a solar cell between a pair of electrically conductive plates, (2) electrically insulating the solar cell from both conductive plates, (3) producing an electric field between the plates in the same polarity as the solar cell with a potential source in the range of 150 to 1500 volts D.C., (4) simultaneously maintaining the solar cell at a constant temperature in the range of 150° to 300° C., and (5) maintaining the solar cell in the electric field and elevated temperature for a predetermined time in the range of two minutes to one hour.

6. The method as set forth in claim 5 in which the electrical insulation between the solar cell and the conductive plates is maintained relatively thin.

7. The method of improving the current response characteristic of solar cells comprising:

(1) connecting a solar cell between a pair of conductive plates, (2) electrically insulating the solar cell from one of the conductive plates, (3) energizing the conductive plates with a source of D.C. potential in the range of 150 to 1500 volts to produce an electric field between the plates of the same polarity as the solar cell, (4) simultaneously subjecting the solar cell to constant heat at a temperature in the range of 150° to 300° C., and (5) maintaining the solar cell in the electric field and elevated temperature for a predetermined period in the range of two minutes to one hour

8. The method as set forth in claim 7 in which the positive terminal of the solar cell is connected to the conductive plate connected to the positive side of the potential source, and the negative terminal of the solar cell is insulated from the conductive plate connected to the negative side of the potential source.

9. The method as set forth in claim 7 in which the negative terminal of the solar cell is connected to the conductive plate connected to the negative side of the potential source, and the positive terminal of the solar cell is insulated from the conductive plate connected to the positive side of the potential source.

10. The method of improving the current response characteristic of solar cells and quantum yield of the cells at a desired wave length comprising:

(1) connecting a solar cell between a pair of conductive plates, (2) insulating the solar cell from one of the conductive plates, (3) energizing the conductive plates with a 600 volt D.C. source to produce an electric field between the plates of the same polarity as the solar cell, (4) simultaneously subjecting the solar cell to heat at a temperature of 175° C., and (5) maintaining the solar cell in the electric field and elevated temperature for a period of approximately one hour.

11. In the manufacture of solar cells of the P on N, and N on P types, the method of improving the response characteristics of the solar cells comprising:

(1) connecting the P and N component parts between a pair of conductive plates, (2) electrically insulating the P and N components from at least one of the conductive plates, (3) energizing the conductive plates with a source of D.C. potential in the range of 150 to 1500 volts to produce an electric field between the plates of the same polarity as the P and N components, (4) simultaneously subjecting the P and N components to constant heat at a temperature in the range of 150° to 300° C., (5) maintaining the P and N components in the electric field and elevated temperature for a predetermined period in the range of two minutes to one hour, (6) cooling the P and N components, and (7) assembling the P and N components to form a solar cell.

References Cited

UNITED STATES PATENTS 3,303,059 2/1967 Kerr et al. ___________ 148—13

RICHARD O. DEAN, *Primary Examiner.*

U.S. Cl. X.R.

148—181